(12) United States Patent
Tsuru

(10) Patent No.: US 9,384,943 B2
(45) Date of Patent: Jul. 5, 2016

(54) ION GENERATING APPARATUS AND METHOD OF REMOVING A FLUORINE COMPOUND DEPOSITED IN A SOURCE HOUSING THEREOF

(75) Inventor: Kiyohiro Tsuru, Chiba (JP)

(73) Assignee: SII Semiconductor Corporation (JP)

( * ) Notice: Subject to any disclaimer, the term of this patent is extended or adjusted under 35 U.S.C. 154(b) by 1098 days.

(21) Appl. No.: 12/807,852

(22) Filed: Sep. 15, 2010

(65) Prior Publication Data

US 2011/0062346 A1     Mar. 17, 2011

(30) Foreign Application Priority Data

Sep. 17, 2009    (JP) .................................. 2009-216241

(51) Int. Cl.
*H01J 37/08* (2006.01)
*H01J 37/317* (2006.01)

(52) U.S. Cl.
CPC ............. *H01J 37/3171* (2013.01); *H01J 37/08* (2013.01); *H01J 2237/022* (2013.01)

(58) Field of Classification Search
CPC .. H01J 37/08; H01J 37/3171; H01J 2237/022

USPC .......................... 250/435 R–427; 315/111.81
See application file for complete search history.

(56) References Cited

U.S. PATENT DOCUMENTS 7,812,321 B2 * 10/2010 Kurunczi et al. ............. 250/424
2009/0032728 A1 * 2/2009 DiVergilio et al. ........... 250/424

OTHER PUBLICATIONS

Patent Abstracts of Japan, publication No. 2001-167707, publication date Jun. 22, 2001.
Patent Abstracts of Japan, publication No. 2001-167728, publication date Jun. 22, 2001.

* cited by examiner

*Primary Examiner* — Robert Kim
*Assistant Examiner* — Eliza Osenbaugh-Stewar
(74) *Attorney, Agent, or Firm* — Adams & Wilks

(57) ABSTRACT

Provided is an ion generating apparatus. The ion generating apparatus includes opposed electrodes connected to a high-frequency power supply, and hence, even in a case where a cathode filament is broken, hydride gas can be ionized to generate hydrogen ion. Thus, a fluorine compound deposited in a source housing is reduced in vacuum, and gas containing fluorine generated due to the above-mentioned reduction reaction is discharged with a vacuum pump.

2 Claims, 3 Drawing Sheets

ION GENERATING APPARATUS AND METHOD OF REMOVING A FLUORINE COMPOUND DEPOSITED IN A SOURCE HOUSING THEREOF

BACKGROUND OF THE INVENTION

1. Field of the Invention

The present invention relates to an ion generating apparatus constituting an ion implantation apparatus.

2. Description of the Related Art

FIGS. 3A and 3B are schematic diagrams each illustrating an example of a conventional ion generating apparatus. As illustrated in FIG. 3A, an ion generating apparatus 9 includes: a chamber 7; a cathode 8 for generating thermal electrons within the chamber; a filament 1 arranged outside of the chamber 7 and in the vicinity of the cathode 8; a direct-current power supply 2 connected in series to the filament 1; a gas introduction port 5 for introducing gas into the chamber 7; and an ion beam take-out port 6 for taking out ions generated within the chamber 7 to the outside of the chamber. In FIG. 3B, the filament 1 is arranged in the inside of the chamber 7.

In an ion implantation apparatus, when ion implantation process is performed in which fluorine compound gas such as boron trifluoride ($BF_3$) is used as ion source gas, a deposit containing fluorine generated from the fluorine compound gas is deposited in the above-mentioned ion generating apparatus, a source housing, and the like. In order to clean the ion generating apparatus, the source housing, and the like, it is necessary to expose the ion generating apparatus, the source housing, and the like to the atmosphere. However, the deposit containing the fluorine and moisture contained in the atmosphere react with each other to generate hydrogen fluoride (HF), and hence there is a fear of dispersion of vapor containing HF within a clean room.

In order to prevent the dispersion of the vapor containing HF into the clean room, the following counter-measure has been taken. For example, the source housing is purged with the atmosphere before the source housing is vacuumed with a vacuum pump, and then the above-mentioned atmosphere purge step is repeated, and hence the amount of the deposit containing the fluorine decreases. Otherwise, a channel through which the atmosphere containing HF vapor is discharged is provided with a discharge channel including a gas cleaning device and with a suction and discharge pump (for example, see Japanese Patent Application Laid-open No. 2001-167728 and No. 2001-167707).

Meanwhile, the following fact is empirically known. When an ion implantation process using hydride gas such as phosphine ($PH_3$) is performed after an ion implantation process using the fluorine compound gas such as $BF_3$, a reduction reaction is achieved between hydrogen ion generated through ionizing the hydride gas and a deposit containing the fluorine to make HF vapor, which is discharged by the vacuum pump, decreasing the deposit containing the fluorine. Accordingly, the following process is also effective. Specifically, before exposed to the atmosphere, the hydride gas is ionized to generate the hydrogen ion and is introduced into the source housing, and then introduction of the hydride gas is stopped and inert gas such as argon (Ar) gas is in turn introduced therein. In this way, concentration of the hydride gas is lowered. After that, the atmosphere purge is performed.

In the ion implantation apparatus in which the fluorine compound gas such as $BF_3$ and the hydride gas such as arsine ($AsH_3$) or $PH_3$ are introduced as ion source, it is effective that, before exposed to the atmosphere, the hydride gas is ionized and is caused to react with the deposit containing the fluorine deposited in the source housing and the like, to thereby remove the deposit. By the way, as one example case of exposure to the atmosphere, in order to interchange a cathode filament if the cathode filament is broken, the source housing may be exposed to the atmosphere. As a case where the cathode filament is broken, there is a case where the cathode filament is broken during ion implantation using the hydride gas, or a case where the cathode filament is broken during ion implantation using the fluorine compound gas. In the case where the cathode filament is broken during ion implantation using the hydride gas, introduction of the hydride gas is stopped and exposure to the atmosphere is performed through substituting the inert gas or the atmosphere for the hydride gas. Meanwhile, in the case where the cathode filament is broken during ion implantation using the fluorine compound gas, it is impossible to introduce the hydride gas in place of the fluorine compound gas so as to ionize the hydride gas. With this regard, the present invention provides a method of removing the fluorine compound deposited in the source housing and the like through ionizing, after the cathode filament is broken, the hydride gas under a state in which the cathode filament is broken.

SUMMARY OF THE INVENTION

In order to solve the above-mentioned problem, the following means are taken.

First, according to the present invention, there is provided an ion generating apparatus, including: a chamber; a cathode for generating thermal electrons within the chamber; a filament arranged outside of the chamber and arranged in the vicinity of the cathode; a direct-current power supply connected in series to the filament; a gas introduction port for introducing gas into the chamber; an ion beam take-out port for taking out ions generated within the chamber to the outside of the chamber; a pair of opposed electrodes arranged to face to each other within the chamber; and a high-frequency power supply arranged in the outside of the chamber and connected to the pair of opposed electrodes.

Further, according to the present invention, there is provided an ion generating apparatus, including: a chamber; a filament arranged within the chamber for generating thermal electrons; a direct-current power supply connected in series to the filament; a gas introduction port for introducing gas into the chamber; an ion beam take-out port for taking out ions generated within the chamber to an outside of the chamber; opposed electrodes provided at both ends of the filament, each of which is arranged between the direct-current power supply and the filament; and a high-frequency power supply arranged in parallel to the direct-current power supply, the ion generating apparatus allowing connection between the direct-current power supply and the opposed electrodes and connection between the high-frequency power supply and the opposed electrodes to be selected with a switch.

According to the present invention, even in a case where the cathode filament is broken, the high-frequency power supply is applied to the opposed electrodes provided for ionizing the hydride gas to ionize the hydride gas, to thereby generate the hydrogen ion. Thus, the fluorine compound deposited in a source housing is reduced in vacuum, and gas containing fluorine generated due to the above-mentioned reduction reaction is discharged with a vacuum pump, and hence it is possible to safely discharge the gas containing the fluorine into a gas cleaning installation. Further, HF gas gen-

DETAILED DESCRIPTION OF THE INVENTION

Hereinafter, ion generating apparatus according to embodiments of the present invention are described with reference to the drawings.

(First Embodiment)

Figure 1A:
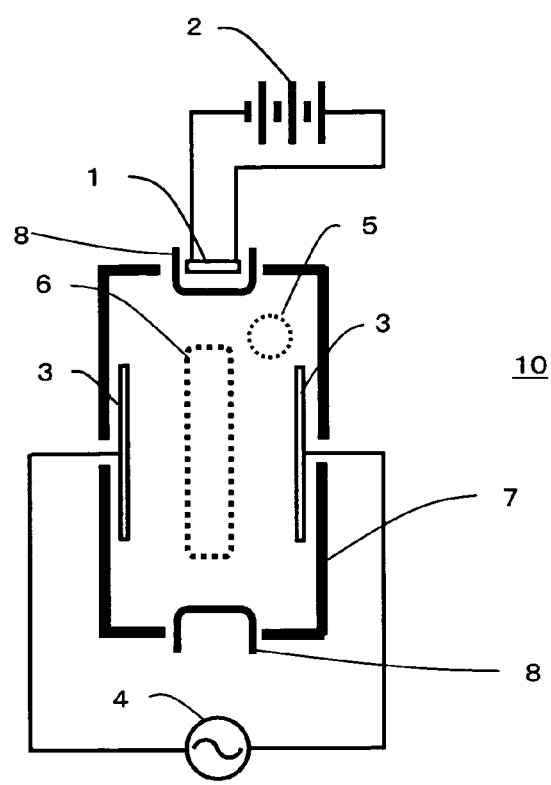
FIGS. 1A and 1B are schematic diagrams each illustrating an ion generating apparatus according to a first embodiment of the present invention.

FIG. 1A is a schematic diagram illustrating an ion generating apparatus according to a first embodiment of the present invention.

As illustrated in FIG. 1A, an ion generating apparatus 10 includes: a chamber 7; a cathode 8 arranged within the chamber, for generating thermal electrons; a filament 1 arranged outside of the chamber 7 and arranged in the vicinity of the cathode 8; a direct-current power supply 2 connected in series to the filament 1; a gas introduction port 5 for introducing gas into the chamber 7; an ion beam take-out port 6 for taking out ions generated within the chamber 7 to the outside of the chamber; a pair of opposed electrodes 3 arranged to face to each other within the chamber 7; and a high-frequency power supply 4 arranged in the outside of the chamber 7 and connected to the pair of opposed electrodes 3. Note that, as illustrated in the drawings, another cathode 8 is arranged at a lower end of the chamber 7, and another filament 1 (not shown) is provided in vicinity of this cathode 8, the another filament 1 being connected to the direct-current power supply 2.

Figure 1B:
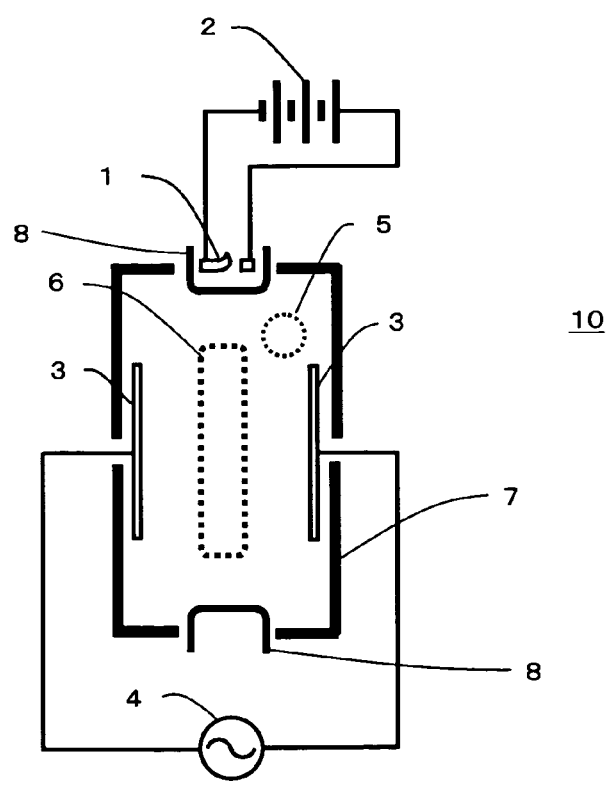

When ion implantation is performed with respect to a wafer, the direct-current power supply 2 is connected to the filament 1 to apply current thereto. Then, the thermal electrons generated from the filament 1 are utilized to ionize the gas introduced through the gas introduction port 5. After that, ions are taken out through the ion beam take-out port 6. The taken-out ions are injected as an ion beam through a beam line portion to the wafer disposed on a disk. However, if the filament 1 is broken as illustrated in FIG. 1B, ionization with the filament 1 can not be performed any more. In this regard, in this case, a system of the high-frequency power supply 4, which is connected to the opposed electrodes 3, is used to ionize the gas. The hydride gas is introduced through the gas introduction port 5, and high frequency is applied to the opposed electrodes 3 to ionize the hydride gas, to thereby generate hydrogen ions. The hydrogen ions are discharged through the ion beam take-out port 6 into a source housing. The fluorine compound deposited in the source housing is reduced and gas containing generated fluorine is discharged with a vacuum pump. In this way, it is possible to remove a deposit containing the fluorine deposited in the source housing and the like.

(Second Embodiment)

Figure 2A:
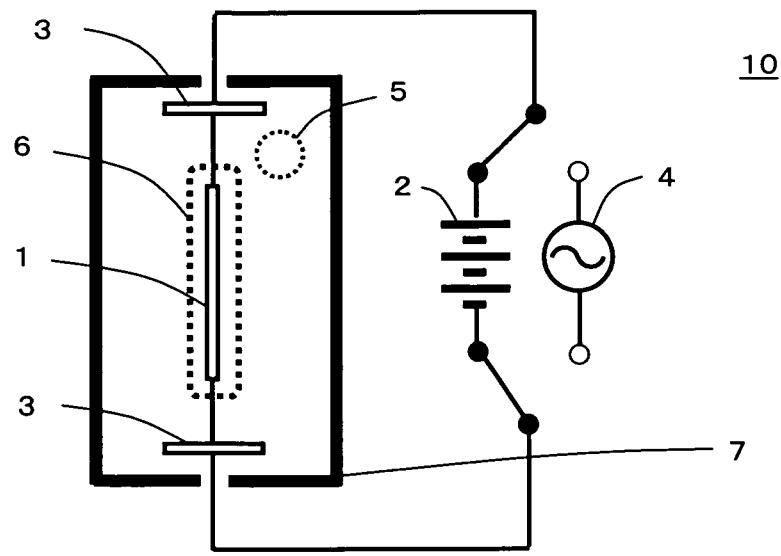
FIGS. 2A and 2B are schematic diagrams each illustrating an ion generating apparatus according to a second embodiment of the present invention.

As illustrated in FIG. 2A, an ion generating apparatus 10 includes: a filament 1 arranged within a chamber 7, for generating thermal electrons; a direct-current power supply 2 connected in series to the filament 1; a gas introduction port 5 for introducing gas into the chamber 7; an ion beam take-out port 6 for taking out ions generated within the chamber 7 to outside the chamber; opposed electrodes 3 provided at both ends of the filament 1 within the chamber 7, each of which is arranged between the direct-current power supply 2 and the filament 1; and a high-frequency power supply 4 arranged in parallel to the direct-current power supply 2. Note that, the connection between the direct-current power supply 2 and the opposed electrodes 3, and between the high-frequency power supply 4 and the opposed electrodes 3 can be selected with a switch.

Figure 2B:
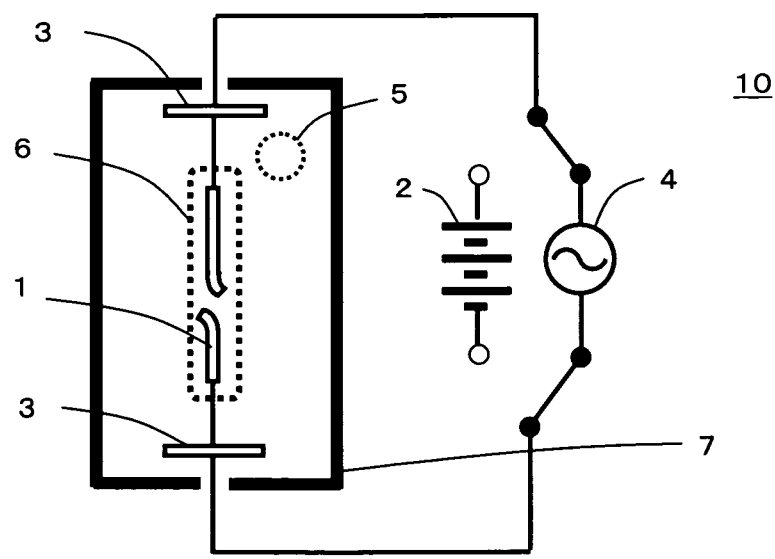
Figure 3A:
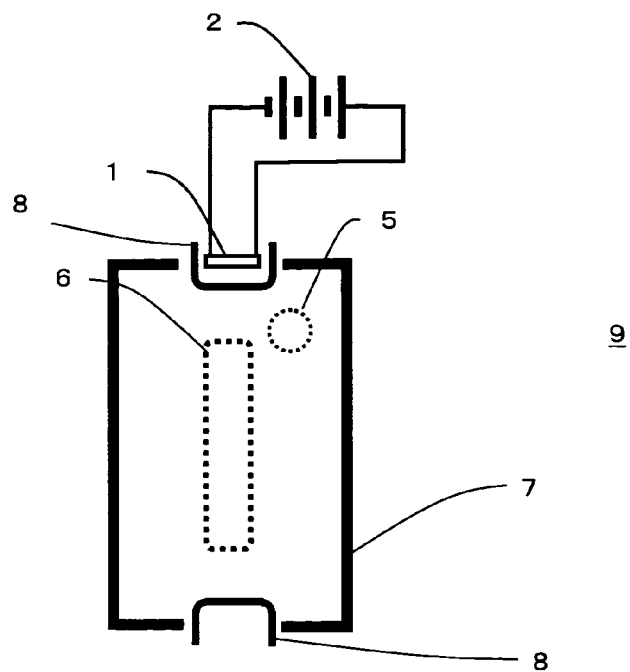
FIGS. 3A and 3B are schematic diagrams each illustrating an example of a conventional ion generating apparatus.
Figure 3B:
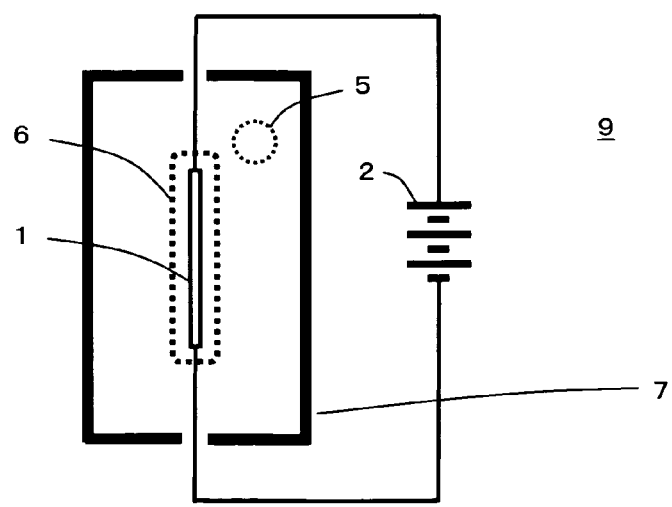

When ion implantation is performed with respect to a wafer, the direct-current power supply 2 is connected to the filament 1 to apply current thereto. Then, the thermal electrons generated from the filament 1 are utilized to ionize the gas introduced through the gas introduction port 5. After that, ions are taken out through the ion beam take-out port 6. However, if the filament 1 is broken as illustrated in FIG. 2B, ionization with the filament 1 can not be performed anymore. In this case, the direct-current power supply 2 is disconnected from the opposed electrodes 3 and the opposed electrodes 3 and the high-frequency power supply 4 are connected to each other. Then, the hydride gas is introduced through the gas introduction port 5, and high frequency is applied to the opposed electrodes 3 to ionize the hydride gas, to thereby generate hydrogen ions. The hydrogen ions are discharged through the ion beam take-out port 6 into a source housing. The fluorine compound deposited in the source housing is reduced and gas containing generated fluorine is discharged with a vacuum pump. In this way, it is possible to remove the deposit containing the fluorine deposited in the source housing and the like.

What is claimed is:

1. A method of removing a fluorine compound deposited in a source housing of an ion generating apparatus after a filament of the apparatus breaks during an ion implantation process using a fluorine compound gas, the ion generating apparatus comprising:

a chamber;

a filament arranged within the chamber for generating thermal electrons;

a direct-current power supply connected in series to the filament;

a gas introduction port for introducing gas into the chamber;

an ion beam take-out port for taking out ions generated within the chamber to outside the chamber;

opposed electrodes provided at both ends of the filament and electrically connected in series with the filament, each of the electrodes being arranged between the direct-current power supply and the filament; and a high-frequency power supply arranged in parallel to the direct-current power supply, the ion generating apparatus allowing connection between the direct-current power supply and the opposed electrodes and connection between the high-frequency power supply and the opposed electrodes to be selected with a switch, the method comprising:

disconnecting the direct-current power supply from the opposed electrodes and connecting the opposed electrodes and the high-frequency power supply to each other after breakage of the filament;

introducing a hydride gas through the gas introduction port;

applying high frequency power to the opposed electrodes to ionize the hydride gas, to thereby generate hydrogen ions; and discharging the hydrogen ions through the ion beam take-out port into the source housing, reducing the fluorine compound deposited within the source housing, and discharging gas containing generated fluorine with a vacuum pump, whereby during ion implantation using fluorine compound gas, the deposited fluorine compound is removed through ionizing the hydride gas under a condition in which the filament is broken.

2. An ion generating apparatus having a source housing on which a fluorine compound deposits during use of the apparatus, comprising:

a chamber;

a filament arranged within the chamber for generating thermal electrons;

a direct-current power supply connected in series to the filament;

a gas introduction port for introducing gas into the chamber;

an ion beam take-out port for taking out ions generated within the chamber to outside the chamber;

opposed electrodes provided at both ends of the filament and electrically connected in series with the filament, each of which is arranged between the direct-current power supply and the filament; and a high-frequency power supply arranged in parallel to the direct-current power supply, the ion generating apparatus allowing connection between the direct-current power supply and the opposed electrodes and connection between the high-frequency power supply and the opposed electrodes to be selected with a switch.

* * * * *